US011789047B2

(12) United States Patent
He et al.

(10) Patent No.: US 11,789,047 B2
(45) Date of Patent: Oct. 17, 2023

(54) STEADY STATE FAULT CURRENT CALCULATION METHOD FOR MODULAR MULTILEVEL CONVERTER

(71) Applicant: BEIJING JIAOTONG UNIVERSITY, Beijing (CN)

(72) Inventors: Jinghan He, Beijing (CN); Meng Li, Beijing (CN); Yiping Luo, Beijing (CN); Xiaojun Wang, Beijing (CN); Yin Xu, Beijing (CN); Dahai Zhang, Beijing (CN); Guomin Luo, Beijing (CN); Fang Zhang, Beijing (CN); Xiangyu Wu, Beijing (CN); Pinghao Ni, Beijing (CN); Ying Wang, Beijing (CN)

(73) Assignee: BEIJING JIAOTONG UNIVERSITY, Beijing (CN)

( * ) Notice: Subject to any disclaimer, the term of this patent is extended or adjusted under 35 U.S.C. 154(b) by 0 days.

(21) Appl. No.: 17/634,170

(22) PCT Filed: Oct. 20, 2020

(86) PCT No.: PCT/CN2020/122169
§ 371 (c)(1),
(2) Date: Feb. 9, 2022

(87) PCT Pub. No.: WO2022/007232
PCT Pub. Date: Jan. 13, 2022

(65) Prior Publication Data
US 2023/0124831 A1   Apr. 20, 2023

(30) Foreign Application Priority Data
Jul. 6, 2020 (CN) .......................... 202010641371.3

(51) Int. Cl.
*G08B 21/00* (2006.01)
*G01R 19/165* (2006.01)
*H01H 83/14* (2006.01)

(52) U.S. Cl.
CPC ..... *G01R 19/16571* (2013.01); *H01H 83/144* (2013.01)

(58) Field of Classification Search
CPC .............. G01R 19/16571; G01R 31/42; G01R 19/0092; H01H 83/144; Y02E 60/60;
(Continued)

(56) References Cited

U.S. PATENT DOCUMENTS

9,190,930 B2 * 11/2015 Inoue .................. H02M 7/4835
9,515,565 B2 * 12/2016 Gupta .................. H02M 7/162
(Continued)

*Primary Examiner* — Anh V La
(74) *Attorney, Agent, or Firm* — CBM PATENT CONSULTING, LLC (57) ABSTRACT

A method for calculating the steady-state fault current of a modular multilevel converter (MMC) comprises calculating the dc-side critical resistance values $R_{A/B}$, $R_{B/C}$ and $R_{C/D}$ of the MMC based on the bridge arm inductance coefficient k and the ac-side reactance $X_{ac}$ of the MMC; Then, determining the operating modes of the MMC based on $R_{A/B}$, $R_{B/C}$ and $R_{C/D}$, and calculating the steady-state dc fault current and the conduction overlap angle respectively under various operating modes without considering the ac-side resistance based on the parameters k, $U_s$, $R_{dc}$ and the dc-side critical resistance values $R_{A/B}$, $R_{B/C}$ and $R_{C/D}$; After that the steady-state AC fault current amplitude and phase angle for each operating mode without considering the AC side resistance are calculated based on the DC current and conduction overlap angle for each operating mode, respectively. Finally, the steady-state AC fault current amplitude and phase angle are calculated for various operating modes considering the AC side resistance.

7 Claims, 4 Drawing Sheets

(58) Field of Classification Search
CPC .... G06F 17/18; H02H 1/0007; H02H 1/0092; H02H 7/125; H02J 3/36; H02J 2203/10; H02J 3/1857; H02M 7/1552; H02M 7/4835; H02M 1/32
USPC .............. 340/664, 657; 361/62, 57; 363/125
See application file for complete search history.

(56) References Cited

U.S. PATENT DOCUMENTS

| | | | |
|---|---|---|---|
| 2013/0128636 A1* | 5/2013 | Trainer | H02J 3/36 363/65 |
| 2014/0328093 A1* | 11/2014 | Zhang | H02H 7/125 363/51 |
| 2017/0033708 A1* | 2/2017 | Elserougi | H02H 7/1257 |

* cited by examiner

Fig.1

Fig.2 without considering AC side resistances    considering AC side resistances

STEADY STATE FAULT CURRENT CALCULATION METHOD FOR MODULAR MULTILEVEL CONVERTER

TECHNICAL FIELD

The invention relates to the technical field of DC power grid, in particular to a calculation method of steady-state fault current of modular multilevel converter (MMC).

BACKGROUND ART

With the continuous development of renewable energy and the continuous improvement of users' requirements for power supply quality and reliability, flexible DC transmission and distribution network technology based on Voltage Source Converter (VSC) has attracted extensive attention. In the existing VSC topologies, the MMC has become the most promising one due to its modular design, low loss and high shape quality. At present, several DC power grids based on modular multilevel converter have been put into operation.

One of the biggest challenges of flexible DC power grid is DC side fault protection. Due to the small damping of DC system, in the case of DC side short-circuit fault, the DC fault current usually rises to more than ten times of the rated value in a very short time. In order to design effective protection scheme and reasonably select equipment, the DC short-circuit fault current must be accurately estimated. However, most of the existing fault current calculation methods are based on numerical solution. Although the specific waveform can be given in a single fault scenario, there are also some problems such as the contradiction between calculation accuracy and efficiency, restricted by the model, and unable to reveal the influence mechanism of parameters on fault current. With the continuous development of DC power grid construction, it has become an inevitable choice to get rid of the dependence on simulation and establish fault analysis method to fundamentally solve the problems of flexible DC power grid fault protection and ensure its long-term development.

In order to analyze and calculate the fault current, the existing technology usually divides the MMC fault process into two stages, i.e., the pre-blocking stage and the post-blocking stage. Before the MMC is blocked, the fault current is mainly the sub module discharging current, so the MMC can be approximately equivalent to a linear RLC (resistance, inductance and capacitor in series) discharging circuit. The analytical calculation of DC fault current at this stage is relatively mature, while the fault current at AC side is usually negligible due to its small fault current. The post blocking stage is also called AC feeding stage. In this stage, AC power supply becomes the main source of fault current, and large fault current will be generated on both AC and DC sides. There are few reports on the analytical calculation of AC and DC fault current at this stage, and an accurate analytical calculation method of fault current has not been formed yet. In order to establish the analytical calculation method of fault current in AC feeding stage, it is necessary to predict the steady-state AC and DC fault current in the AC feeding stage.

At present, a calculation method of steady-state fault current of flexible DC power grid in the prior art is: the calculation method of steady-state fault current based on iec61660 standard. This method assumes that the MMC has only three arms conducted at the same time in the AC infeed stage. Based on this assumption, the calculation formula of steady-state DC fault current of six pulse diode rectifier bridge is given. The disadvantage of this method is that the arm inductance and multiple working modes of the MMC are not considered, so it is not suitable for MMC.

Another method for calculating the steady-state fault current of flexible DC power grid in the prior art is the steady-state fault current calculation method based on the external characteristic curve of rectifier. In this method, the external characteristic curve of diode rectifier bridge is piecewise linearized, and the converter in each stage is equivalent to a voltage source with internal resistance, and then the piecewise expression of fault steady-state fault current is obtained. The disadvantages of this method are: because the external characteristic method of converter does not consider the influence of AC system resistances, when the method is used in the scenario with large AC power grid resistances, there will be obvious calculation error, and the steady-state AC side fault current can not be obtained. In addition, the method needs additional iterative algorithm to determine the specific working mode of the MMC, and the calculation process is complex.

SUMMARY OF INVENTION

The embodiment of the invention provides a method for calculating the steady-state fault current of a modular multilevel converter to overcome the shortcomings of the prior art.

In order to achieve the above purpose, the invention adopts the following technical scheme.

A calculation method of steady-state fault current of modular multilevel converter, comprising:

Step 1: obtain the parameters of the modular multilevel converter MMC: k, $U_s$, $X_{ac}$, $R_{dc}$, $U_s$. Among them, $U_s$ is the power supply amplitude at the AC side of the converter, k is the bridge arm inductance coefficient, $U_s$ is the phase voltage amplitude of the equivalent power supply at the AC side of the MMC, $X_{ac}$ is the equivalent reactance at the AC side of the MMC, $R_{dc}$ and is the resistance at the DC side of the MMC. Calculate the DC side critical resistance value $R_{A/B}$, $R_{B/C}$ and $R_{C/D}$ of the MMC according to the parameters;

Step 2: when criterion $R_{A/B} \leq R_{dc}$ is satisfied, the MMC is considered to operate in mode A; When criterion $R_{B/C} \leq R_{dc} \leq R_{A/B}$ is satisfied, the MMC is considered to operate in mode B; When criterion $R_{C/D} \leq R_{dc} \leq R_{B/C}$ is satisfied, the MMC is considered to operate in mode C; When criterion $0 \leq R_{dc} \leq R_{C/D}$ is satisfied, the MMC is considered to operate in mode D; In operating mode A, γ=0°, in operating mode B, 0°<γ<60°, in operating mode C, 60°<γ<120°, in operating mode D, 120°<γ<180°, where γ is the conduction overlap angle of the upper and lower bridge arms of each phase of MMC in half an AC cycle;

Step 3: calculate the average value of steady-state DC fault current $I_{dc}$ and conduction overlap angle β under operating modes A, B, C and D without considering the AC side resistance according to the parameters k, $U_s$, $R_{dc}$ and the DC side critical resistance value $R_{A/B}$, $R_{B/C}$ and $R_{C/D}$, respectively. In operating mode A, β=γ=0°, in operating mode B, 0°<β=γ<60°, in operating mode C, 0°<β=γ−60°<60°, in operating mode D, 0°<β=γ−120°<60°;

Step 4: calculate the steady-state AC fault current amplitude $I_{sm}$ and phase angle φ of operating modes A, B, C and D without considering the AC side resistance according to the DC current and conduction overlap angle of operating modes A, B, C and D.

Preferably, the equivalent circuit structure of MMC fault steady-state stage includes four parts: AC power grid unit, converter transformer, converter and DC side unit connected in series. AC power grid unit includes three-phase equivalent power supply $e_j$ j=a, b, c in parallel, and its amplitude is $U_s$. The three-phase equivalent power supplies $e_a$, $e_b$, and $e_c$ are respectively connected in series with $L_g$ and $R_g$ in the AC power grid unit, $L_t$ and $R_t$ in the converter transformer. $L_g$ and $R_g$ is the equivalent inductance and equivalent resistance of AC power grid, $L_t$ and $R_t$ is the equivalent inductance and equivalent resistance of converter transformer. The three-phase equivalent power supplies $e_a$, $e_b$, and $e_c$ are also connected in series with the A, B and C three-phase diode circuits in the converter. The A-phase diode circuit includes an upper diode D1 and a lower diode D4 connected in series, the B-phase diode circuit includes an upper diode D3 and a lower diode D6 connected in series, and the c-phase diode circuit includes an upper diode D5 and a lower diode D2 connected in series. The DC side unit comprises a DC side inductance $L_{dc}$ and a resistance $R_{dc}$ connected in series; $L_a$ is the MMC bridge arm inductance;

In the working mode A, the upper and lower diodes of each phase of MMC will be turned on 180° alternately, and there are only three diodes in the converter at any time;

In said working mode B, there is both a simultaneous conduction of 3 diodes and a simultaneous conduction of 4 diodes in the converter in ⅙ of the working frequency cycle, with the converter alternating continuously in 3-4 mode.

In said working mode C, there is both simultaneous conduction of 4 diodes and simultaneous conduction of 5 diodes in the converter during ⅙ of the working frequency cycle, with the converter alternating continuously in 4-5 mode.

In said working mode D, there is both a simultaneous conduction of 5 diodes and a simultaneous conduction of 6 diodes in the ⅙ industrial frequency cycle, with the converter alternating continuously in the 5-6 mode.

Preferably, the bridge arm inductance coefficient k is calculated as $$k = \frac{X_a}{X_{ac} + X_a} \quad (1)$$

where $X_{ac} = \omega L_g + \omega L_t$, $X_a = \omega L_a$, $\omega$ is the angular frequency of the AC grid.

Preferably, said calculating the critical resistance value $R_{A/B}$, $R_{B/C}$ and $R_{C/D}$ of the MMC based on said parameters k and $X_{ac}$, comprising:

$$\begin{cases} R_{A/B} = \frac{X_{ac}}{\pi} \frac{9(1+k)}{(3-4k+k^2)} \\ R_{B/C} = \frac{X_{ac}}{\pi} \frac{(k^2-3k)(k-2)\sqrt{9+3k^2}+3\sqrt{7-4k+k^2}}{(k^2-1)(\sqrt{9+3k^2}-k\sqrt{7-4k+k^2})} \\ R_{C/D} = \frac{X_{ac}}{\pi} \frac{(2k-k^2)(\sqrt{7-4k+k^2}-3+k)}{(k-1)(\sqrt{7-4k+k^2}-1-k)} \end{cases} \quad (2)$$

Preferably, said calculating the average values of steady-state DC fault currents $I_{dc}$ and conduction overlap angles β for operating modes A, B, C and D, respectively, when AC side resistance is not considered, based on said parameters k, $U_s$, $R_{dc}$ and critical resistance values $R_{A/B}$, $R_{B/C}$ and $R_{C/D}$, comprising:

The steady-state DC-side fault current of the MMC is the sum of the fault currents of the a,b,c three-phase diode circuit on the upper bridge arm of the MMC, and, i.e. $i_{dc} = i_1 + i_3 + i_5$. The said a,b,c three-phase diode circuit is symmetrical to each other, the waveforms of $i_1$, $i_3$ and $i_5$ are the same, the initial phase angles differ from each other by 120°, and the peak value of the fault current on the steady-state AC side of the MMC is the same as the peak value of the fault current in each phase of the diode circuit.

The current $i_1$ is divided into multiple intervals and solved one by one according to the states of conduction of the diode circuits of phases a, b and c in the described operating modes A, B, C and D. According to the phase angle relationship between $i_1$, $i_3$ and $i_5$, the value of current $i_3$ and $i_5$ are obtained. According to the value of $i_1$, $i_3$ and $i_5$ and the relationship between DC side voltage and current, the steady-state DC fault current average value $I_{dc}$ and conduction overlap angle β of working modes a, B, C and d without considering AC side resistance are deduced.

Preferably, said average values of steady-state DC fault currents Id, and conduction overlap angles β for working modes A, B, C and D, respectively, without considering the AC side resistance, are calculated based on said parameters k, $U_s$, $R_{dc}$ and critical resistance values $R_{A/B}$, $R_{B/C}$ and $R_{C/D}$, comprising:

The relationship between the average value of DC current $I_{dc}$, AC current amplitude $I_{sm}$ and the current of the a-phase diode circuit on the bridge arm $i_1$ in operating mode B is:

$$I_{dc} = i_1(\omega t = \alpha + \beta + \pi/3) \quad (3)$$

$$I_{sm} = i_1(\omega t = \alpha + \beta + \pi/3) \quad (4)$$

where α is the electrical angle corresponding to the moment when the current $i_1$ crosses zero and starts to rise, and β is the onset overlap angle in mode B;

Converting the expressions for taking $I_{dc}$ and $I_{sm}$ into expressions for taking $i_1$ in the interval [α,α+β+π/3]. Splitting the interval [α,α+β+π/3] into three subintervals [α,α+β+π/3] and [α+π/3,α+β+π/3] for segmental solutions:

Derivation Step 1: Solving for DC current

In subinterval 1 ($\omega t \in [\alpha,\alpha+\beta]$), diodes D4, D5, D6, D1 conduct, using the circuit principle to solve the equivalent circuit of the converter at this time to obtain the expressions for the DC voltage $u_{dc}^1$ and bridge arm current $i_1^1$ in subinterval 1.

Similarly, in subinterval 2($\omega t \in [\alpha+\beta,\alpha+\pi/3]$) and subinterval 3[α+π/3,α+β+π/3], find the DC-side voltage and the current of diode D1, respectively, denoted as $u_{dc}^2$, $i_1^2$ and $u_{dc}^3$, $i_1^3$;

Then $i_1$ is expressed as a segmented function, as shown in the following equation.

$$i_1 = \begin{cases} i_1^1, \omega t \in [\alpha, \alpha+\beta] \\ i_1^2, \omega t \in [\alpha+\beta, \alpha+\pi/3] \\ i_1^3, \omega t \in [\alpha+\pi/3, \alpha+\beta+\pi/3] \end{cases} \quad (5)$$

The boundary conditions are shown in the following equation.

$$\begin{cases} i_1^1(\omega t = \alpha) = 0 \\ i_1^2(\omega t = \alpha+\beta) = i_1^1(\omega t = \alpha+\beta) \\ i_1^3(\omega t = \alpha+\pi/3) = i_1^2(\omega t = \alpha+\pi/3) \end{cases} \quad (6)$$

Combining (5) and (6) and substituting $I_{dc}=i_1$ ($\omega t=\alpha+\gamma+\pi/3$) into the expression for $i_1$, the DC current expression is found as:

$$I_{dc}=(U_s/4\omega)(A\sin\beta+B\cos\beta+C) \quad (7)$$

Where, $$\begin{cases} A = (12m-3p)\sin\alpha + \sqrt{3}\,p\cos\alpha \\ B = (-12m+3p)\cos\alpha + \sqrt{3}\,p\sin\alpha \\ C = (12m-3p)\cos\alpha + \sqrt{3}\,p\sin\alpha \end{cases} \quad (8)$$

and $m = \dfrac{1}{3L_{ac}+2L_a},\ n = \dfrac{2(L_{ac}+L_a)}{(L_{ac}+2L_a)}m,\ p = \dfrac{1}{(L_t+L_a)}$.

Derivation step 2: Solving for DC voltage

The DC voltage is obtained by averaging the DC voltage integration over 1/6 of the working frequency period, and the average DC voltage is obtained from the DC voltage of subinterval 1 and subinterval 2 $u_{dc}^1$, $u_{dc}^2$ as follows:

$$U_{dc} = \frac{3}{\pi}\left[\int_{(\alpha)/\omega}^{(\alpha+\gamma)/\omega} u_{dc}^1 d(\omega t) + \int_{(\alpha+\gamma)/\omega}^{(\alpha+\pi/3)/\omega} u_{dc}^2 d(\omega t)\right] \quad (9)$$

Simplification gives:

$$U_{dc} = (3U_s/4\pi)(D\sin\beta + E\cos\beta + F) \quad (10)$$

$$\begin{cases} D = \sqrt{3}(4f-3)\cos\alpha - 3\sin\alpha \\ E = \sqrt{3}(4f-3)\sin\alpha + 3\cos\alpha \\ F = \sqrt{3}(-4f+3)\sin\alpha + 3\cos\alpha \end{cases} \quad (11)$$

And $$f = \frac{L_a}{(L_{ac}+2L_a)}.$$

From equations (7) and (10), it can be seen that the DC voltage and DC current expressions will contain two unknowns, $\alpha$ and $\beta$. In order to find the expressions for DC current and DC voltage, two additional constraints are needed.

For the DC side, the following constraint always exists:

$$U_{dc}=I_{dc}R_{dc}. \quad (12)$$

The value of the initial conduction angle $\alpha$ is predicted.

Derivation step 3: Initial conduction angle prediction

When only diodes D4, D5 and D6 are conducted, the voltage $u_{D1}$ across D1 is obtained, and when $u_{D1}>0$, D1 is on, the converter will have four diodes D4, D5, D6 and D1 on at the same time, consider the moment when $u_{D1}$ crosses zero and starts to grow positively as the initial conduction angle $\alpha$ of current $i_1$. Let $u_{D1}=0$, then the initial conduction phase angle $\alpha$ is obtained to satisfy the following relation:

$$\tan\alpha = \frac{3-k}{\sqrt{3}(k+1)} \quad (13)$$

Derivation Step 4: Analytical expression of steady-state DC fault current

Substituting the two constraints shown in Eqs. (12) and (13) into the DC current and DC voltage expressions, the analytical expression for the mean value of the MMC steady-state DC fault current is obtained as:

$$I_{dc} = \frac{3\sqrt{3}(1-k)\sqrt{3+k^2}\,U_s}{3X_{ac}(3-k)+\pi R_{dc}(1-k^2)} \quad (14)$$

Derivation Step 5: Solving for the conduction overlap angle

Substituting the analytical expression (14) for the mean value of the steady-state DC fault current into (7), the on-state overlap angle $\beta$ is obtained as:

$$\beta = \arcsin\frac{(4\omega/U_s)I_{dc}-C}{\sqrt{A^2+B^2}} + \arctan\frac{B}{A} \quad (15)$$

Derivation Step 6: Steady-state AC fault current amplitude expression

Substituting $i_1$ and $\beta$ into equation (4), the amplitude of the MMC steady-state AC fault current is found as:

$$I_{sm} = \frac{3\sqrt{3}(1-k)\sqrt{3+k^2}\,U_s}{3X_{ac}(3-k)+\pi R_{dc}(1-k^2)} \quad (16)$$

Derivation Step 7: Phase angle expression for steady-state AC fault current

According to the power conservation on the AC and DC sides of the converter, the phase angle $\varphi$ of the MMC steady-state AC fault current is found as:

$$\varphi = \arccos(R_{dc}I_{dc}^2/(U_s I_{sm})) \quad (17).$$

Preferably, said on-state DC fault current average value $I_{dc}$ and on-state overlap angle $\beta$ for operating modes A, B, C and D, respectively, without considering the AC side resistance, calculated from said parameters k, $U_s$, $R_{dc}$ and critical resistance values $R_{A/B}$, $R_{B/C}$ and $R_{C/D}$, comprising:

In working mode A:

The average value of the steady-state DC fault current is $$I_{dc} = \frac{9\sqrt{3}(1-k)U_s}{2\sqrt{(9X_{ac})^2+(\sqrt{3}(1-k)\pi R_{dc})^2}}. \quad (18)$$

The steady-state AC fault current amplitude is:

$$I_{sm} = \frac{\pi}{3}\frac{9\sqrt{3}(1-k)U_s}{2\sqrt{(9X_{ac})^2+(\sqrt{3}(1-k)\pi R_{dc})^2}} \quad (19)$$

In working mode C:

The average value of the steady-state DC fault current is $$I_{dc} = \frac{3(1-k)k\sqrt{7-4k+k^2}\,U_s}{k(6-5k+k^2)X_{ac}+(1-k^2)\pi R_{dc}}. \quad (20)$$

The steady-state AC fault current amplitude is:

$$I_{sm} = \frac{U_s}{X_{ac}} \frac{1}{2(k-3)(k-2)\sqrt{7-4k+k^2}} \begin{pmatrix} 6\sqrt{3}(k-1)(k-2)\sin\beta + \\ (24-55k+41k^2-11k^3+k^4)\cos\beta + \\ (7k-11k^2+5k^3-k^4) \end{pmatrix} \quad (21)$$

where β is obtained by equation (15) in mode C.

The steady-state AC fault current phase angle is obtained by equation (17) in mode C.

In working mode D:
The average value of the steady-state DC fault current is $$I_{dc} = \frac{3k(1-k)U_s}{k(2-k)X_{ac} + (1-k)\pi R_{dc}} \quad (22)$$

The steady-state AC fault current amplitude is:

$$I_{sm} = \frac{U_s}{X_{ac}} \frac{k(k-1)}{(k-2)} \left( \frac{\sqrt{3}}{4}\sin\beta + \frac{1}{4}\cos\beta + 2 \right) \quad (23)$$

where β is obtained by equation (15) in mode D.

Preferably, said method further comprising:
The calculation process of the MMC steady-state AC and DC fault currents considering the AC side resistance includes: the converter without considering the AC side damping is equivalent to a three-phase symmetrical load with impedance Zc (Zc=Rc+jXc), the AC side voltage and current phase quantities of the converter are Ė, İ, and their amplitudes are $U_s$, $I_{sm}$. When the AC side resistance is considered, the equivalent AC side voltage and current phase quantities of the converter are Ė', İ', and their amplitudes are U'$_s$, I'$_{sm}$;

The updated MMC steady-state AC fault current amplitude and phase angle are obtained from the three-phase equivalent circuit diagram as:

$$I'_{sm} = \frac{U_s}{\sqrt{(R_{ac} + R_c)^2 + X_c^2}} \quad (24)$$

$$\varphi' = \arctan\frac{X_c}{R_{ac} + R_c} \quad (25)$$

Where $$R_c = \frac{U_s\cos\varphi}{I_{sm}}, X_c = \frac{U_s\sin\varphi}{I_{sm}}。$$

The updated AC-side power amplitude is:

$$U_s' = \sqrt{(U_s - R_{ac}I_{sm}'\cos(\varphi'))^2 + (R_{ac}I_{sm}'\sin(\varphi'))^2} \quad (26)$$

The MMC steady-state DC fault current considering the AC side resistance is obtained by replacing $U_s$ in the derived expression with the new AC supply amplitude U'$_s$.

In working mode A:
The average value of the steady-state DC fault current when considering the AC side resistance is $$I_{dc} = \frac{9\sqrt{3}(1-k)U_s'}{2\sqrt{(9X_{ac})^2 + (\sqrt{3}(1-k)\pi R_{dc})^2}}.$$

In working mode B:
The average value of the steady-state DC fault current when considering the AC side resistance is $$I_{dc} = \frac{3\sqrt{3}(1-k)\sqrt{3+k^2}\ U_s'}{3X_{ac}(3-k) + \pi R_{dc}(1-k^2)}$$

In working mode C:
The average value of the steady-state DC fault current when considering the AC side resistance is $$I_{dc} = \frac{3(1-k)k\sqrt{7-4k+k^2}\ U_s'}{k(6-5k+k^2)X_{ac} + (1-k^2)\pi R_{dc}}$$

In working mode D:
The average value of the steady-state DC fault current when considering the AC side resistance is $$I_{dc} = \frac{3k(1-k)U_s'}{k(2-k)X_{ac} + (1-k)\pi R_{dc}}$$

From the technical solutions provided by the above embodiments of the present invention, it can be seen that the application of the method of the embodiments of the present invention can simultaneously obtain the fault current values on the AC side and DC side during the steady-state stage of the MMC fault; the calculation accuracy is high, the calculation process is simple, and no additional iterative algorithms are required; it can adapt to scenarios where the resistance of the grid on the AC side is large; and the analytical expression provided can reflect the intrinsic relationship between the system parameters and the steady-state fault current.

Additional aspects and advantages of the present invention will be given in part in the following description, which will become apparent from the following description, or from the practice of the present invention.

BRIEF DESCRIPTION OF INVENTION

In order to more clearly illustrate the technical solutions of the embodiments of the present invention, the following will briefly describe the accompanying drawings to be used in the description of the embodiments, it is obvious that the following description of the accompanying drawings are only some embodiments of the present invention, for the person of ordinary skill in the art, without creative work, can also obtain other accompanying drawings based on these drawings.

EMBODIMENTS

Embodiments of the present invention are described in detail below, and examples of said embodiments are shown in the accompanying drawings, wherein the same or similar designations from beginning to end indicate the same or similar components or components having the same or similar functions. The embodiments described below by reference to the accompanying drawings are exemplary and are intended only to explain the present invention and are not to be construed as limiting the invention.

It will be understood by those of skill in the art that, unless specifically stated, the singular forms "one," "a," "said," and "the" as used herein "may also include the plural form. It should be further understood that the wording "includes" as used in the specification of the present invention refers to the presence of said features, integers, steps, operations, components and/or assemblies, but does not exclude the presence or addition of one or more other features, integers, steps, operations, components, assemblies and/or groups thereof. It should be understood that when we refer to a component as being "connected" or "coupled" to another component, it may be directly connected or coupled to other components, or there may be intermediate components. In addition, "connected" or "coupled" as used herein may include wirelessly connected or coupled. The word "and/or" as used herein includes any and all combinations of one or more of the associated listed items.

It will be understood by those skilled in the art that, unless otherwise defined, all terms used herein, including technical terms and scientific terms, have the same meaning as generally understood by one of ordinary skill in the art to which the present invention belongs. It is also to be understood that terms such as those defined in the general dictionary are to be understood as having a meaning consistent with the meaning in the context of the prior art and, unless defined as herein, are not to be interpreted in an idealized or overly formal sense.

In order to facilitate the understanding of the embodiments of the present invention, the following will be combined with the accompanying drawings to several specific embodiments as examples for further explanation, and each embodiment does not constitute a limitation to the embodiments of the present invention.

The present invention proposes an analytical calculation method for the steady-state fault current of MMC with higher accuracy, better applicability and more concise calculation.

The method obtains the analytical expressions of steady-state AC and DC fault currents considering the AC side resistance by solving the diode currents of the converter in different operating modes by segments.

1 Operating Mode of MMC Fault Steady-State Stage

Figure 1:
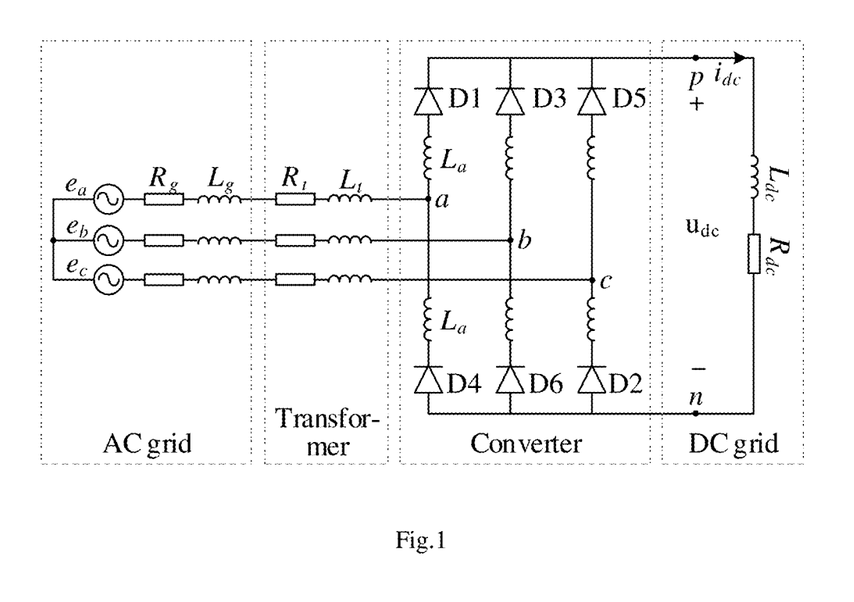
FIG. 1 shows an equivalent circuit diagram of the fault steady-state phase of an MMC provided by an embodiment of the present invention.

The MMC in the fault steady-state stage can be equivalent to a diode uncontrolled rectifier bridge, and the equivalent circuit diagram of the MMC fault steady-state phase is shown in FIG. 1. The equivalent circuit structure of MMC in the fault steady-state stage includes four parts: AC power grid unit, converter transformer, converter and DC side unit connected in series. AC power grid unit includes three-phase equivalent power supply $e_j$ j=a,b,c, in parallel, and its amplitude is $U_s$. The three-phase equivalent power supplies $e_a$, $e_b$, and $e_c$ are respectively connected in series with $L_g$ and $R_g$ in the AC power grid unit and $L_t$ and $R_t$ in the converter transformer. $L_g$ and $R_g$ is the equivalent inductance and equivalent resistance of AC power grid and can be obtained from the short-circuit ratio SCR (Short-circuit ratio) at the common point of the AC side connected to the MMC and the AC grid R/X ratio. $L_t$ and $R_t$ is the equivalent inductance and equivalent resistance of converter transformer (All have been converted to the secondary side of the transformer).

The three-phase equivalent power supplies $e_a$, $e_b$, and $e_c$ are also connected in series with the A, B and C three-phase diode circuits in the converter. The A-phase diode circuit includes an upper diode D1 and a lower diode D4 connected in series, the B-phase diode circuit includes an upper diode D3 and a lower diode D6 connected in series, and the c-phase diode circuit includes an upper diode D5 and a lower diode D2 connected in series. The DC side unit comprises a DC side inductance $L_{dc}$ and a resistance $R_{dc}$ connected in series; $L_a$ is the MMC bridge arm inductance;

In the main operating mode of the conventional six-pulse rectifier bridge, the upper and lower diodes of each phase of the converter alternately conduct 180° in an AC cycle, and the conduction intervals of the upper and lower diodes (equivalent to the upper and lower bridge arms) do not overlap each other, and there are only three diodes conducting at the same time at each moment. However, in the MMC, due to the presence of the bridge arm inductance, there will be an overlap between the upper and lower diode conduction intervals in each phase of the MMC, and more than 3 diodes will be on simultaneously in the overlap interval. Define the angle of overlap of diodes in each phase of the converter as the conduction overlap angle γ (0°≤γ≤180°) in every half AC cycle, then according to the magnitude of the conduction overlap angle γ, there are four main operating modes of the MMC, and the fault current waveforms of the bridge arm current (diode current) under each operating mode are shown in FIG. 2.

1) Working mode A: Similar to the six-pulse rectifier bridge, the upper and lower diodes of each phase of MMC will be turned on 180° alternately, and there are only three diodes in the converter at any time, as shown in FIG. 2(a).

Figure 2:
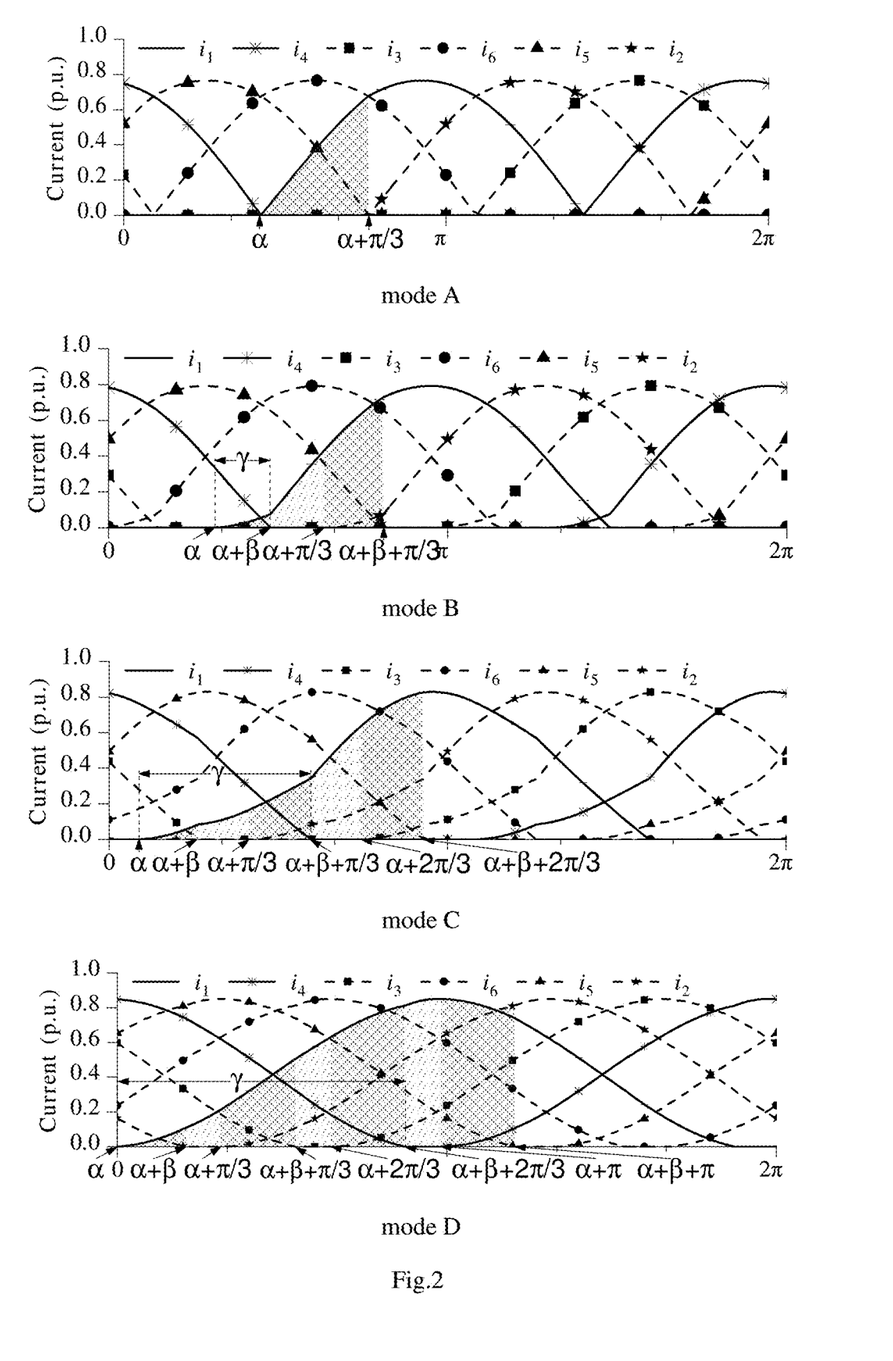
FIG. 2 is a fault current waveform diagram of the bridge arm current (diode current) in four operating modes of an MMC provided by embodiments of the present invention.

2) Working mode B: there is both a simultaneous conduction of 3 diodes and a simultaneous conduction of 4 diodes in the converter in ⅙ of the working frequency cycle, with the converter alternating continuously in 3-4 mode, as shown in FIG. 2(b).

3) Working mode C: there is both simultaneous conduction of 4 diodes and a simultaneous conduction of 5 diodes in the converter during ⅙ of the working frequency cycle, with the converter alternating continuously in 4-5 mode, as shown in FIG. 2(c).

4) Working mode D: there is both a simultaneous conduction of 5 diodes and a simultaneous conduction of 6 diodes in the ⅙ industrial frequency cycle, with the converter alternating continuously in the 5-6 mode, as shown in FIG. 2(d).

2 MMC Steady-State AC and DC Fault Current Calculation Principle

MMC steady-state AC and DC side fault currents are solved as follows: from FIG. 1 and FIG. 2, DC current can be expressed as the sum of the currents of the three diodes on the upper bridge arm ($i_{dc}=i_1+i_3+i_5$), while the peak AC side current is the same as the peak diode current, so the AC and DC side currents can be obtained by finding the diode current. Considering that a, b, c phase is symmetrical, which means that $i_1$, $i_3$, $i_5$ fault current waveforms are the same and the initial phase angle is 120°, so we only need to solve the current expression of any one diode to get the current expression of all diodes, and then get the steady-state AC and DC fault current values. Since the MMC switching state is constantly changing, it is impossible to characterize the diode currents with a continuous analytical formula. For this reason, the present invention takes one conduction state (e.g., only 3 diodes are on or only 4 diodes are on) as a calculation interval and divides the diode currents into multiple intervals for solving one by one.

Based on the above idea, the present invention derives the steady-state DC fault currents of the MMC in different operating modes by solving the diode currents of the upper bridge arm of phase A ($i_1$).

To facilitate the expression of the current $i_1$, the following preparations are made:

(1) The phase angle corresponding to the moment when the fault current $i_1$ crosses zero and starts to rise in each mode is defined as the initial conduction angle α, as shown in FIG. 2.

(2) In mode B, let γ=β. Similarly, in mode C and mode D, let γ=β+π/3 and γ=β+2π/3 respectively. Then, in mode A, γ=β=0, and the range of value β is 0≤β≤π/3, as shown in FIG. 2.

(3) Define the bridge arm inductance coefficient k as shown in equation (51), where $X_{ac}=\omega L_g+\omega L_t$, $X_a=\omega L_a$.

$$k = \frac{X_a}{X_{ac} + X_a} \quad (1)$$

(4) The following assumptions are made in the derivation: a. Assume that the DC-side inductance is infinite, implying that the ripple of the DC-side current is not considered and the average value of the DC-side steady-state current is obtained. b. Ignore the bridge arm resistance and the AC-side resistance.

Case of Steady-State DC Fault Current and AC Fault Current Derivation in Mode B.

Taking mode B as an example, it can be seen from FIG. 2(b) that when the DC ripple is neglected, the average DC current $I_{dc}$ and the AC current amplitude $I_{sm}$ are related to the bridge arm current $i_1$ as follows $$I_{dc}=i_1(\omega t=\alpha+\beta+\pi/3) \quad (2)$$

$$I_{sm}=i_1(\omega t=\alpha+\beta+\pi/3) \quad (3)$$

The current can be found by phase shifting, so finding $i_1$ is equivalent to finding $i_3$ $i_5$. In this interval of the calculation, neither D3 nor D5 is on, only D1 is on, so we have $I_{dc}=i_1(\omega t=\alpha+\beta+\pi/3)$.

Converting the expressions for taking $I_{dc}$ and $I_{sm}$ into expressions for taking $i_1$ in the interval [α,α+β+π/3]. Splitting the interval [α,α+β+π/3] into three subintervals [α,α+β], [α+β,α+π/3] and [α+π/3, α+β+π/3] for segmental solutions:

Derivation Step 1: Solving for DC current

In subinterval 1 ($\omega t \in [\alpha,\alpha+\beta]$), diodes D4, D5, D6, D1 conduct, using the circuit principle to solve the equivalent circuit of the converter at this time to obtain the expressions for the DC voltage $u_{dc}^1$ and bridge arm current $i_1^1$ in subinterval 1 (where the superscript "1" indicates the electrical quantity in the first subinterval).

Similarly, in subinterval 2($\omega t \in [\alpha+\beta,\alpha+\pi/3]$) and subinterval 3[α+π/3,α+β+π/3], find the DC-side voltage and the current of diode D1, respectively, denoted as $u_{dc}^2$, $i_1^2$ and $u_{dc}^3$, $i_1^3$;

Then $i_1$ is expressed as a segmented function, as shown in the following equation.

$$i_1 = \begin{cases} i_1^1, \omega t \in [\alpha, \alpha+\beta] \\ i_1^2, \omega t \in [\alpha+\beta, \alpha+\pi/3] \\ i_1^3, \omega t \in [\alpha+\pi/3, \alpha+\beta+\pi/3] \end{cases} \quad (4)$$

The boundary conditions are shown in the following equation.

$$\begin{cases} i_1^1(\omega t = \alpha) = 0 \\ i_1^2(\omega t = \alpha+\beta) = i_1^1(\omega t = \alpha+\beta) \\ i_1^3(\omega t = \alpha+\pi/3) = i_1^2(\omega t = \alpha+\pi/3) \end{cases} \quad (5)$$

Combining (54) and (55) and substituting $I_{dc}=$, $i_1(\omega t=\alpha+\gamma+\pi/3)$ into the expression for $i_1$, the DC current expression is found as:

$$I_{dc}=(U_s/4\omega)(A \sin \beta + B \cos \beta + C) \quad (6)$$

Where, $$\begin{cases} A = (12m - 3p)\sin\alpha + \sqrt{3} p\cos\alpha \\ B = (-12m + 3p)\cos\alpha + \sqrt{3} p\sin\alpha \\ C = (12m - 3p)\cos\alpha + \sqrt{3} p\sin\alpha \end{cases} \quad (7)$$

And $$m = \frac{1}{3L_{ac} + 2L_a}, n = \frac{2(L_{ac}+L_a)}{(L_{ac}+2L_a)}m, p = \frac{1}{(L_t+L_a)}.$$

Derivation step 2: Solving for DC voltage

The DC voltage is obtained by averaging the DC voltage integration over ⅙ of the working frequency period, and the average DC voltage is obtained from the DC voltage of subinterval 1 and subinterval 2 $u_{dc}^1$, $u_{dc}^2$ as follows:

$$U_{dc} = \frac{3}{\pi}\left[\int_{(\alpha)/\omega}^{(\alpha+\gamma)/\omega} u_{dc}^1 d(\omega t) + \int_{(\alpha+\gamma)/\omega}^{(\alpha+\pi/3)/\omega} u_{dc}^2 d(\omega t)\right] \quad (8)$$

Simplification gives:

$$U_{dc} = (3U_s/4\pi)(D\sin\beta + E\cos\beta + F) \quad (9)$$

$$\begin{cases} D = \sqrt{3}(4f-3)\cos\alpha - 3\sin\alpha \\ E = \sqrt{3}(4f-3)\sin\alpha + 3\cos\alpha \\ F = \sqrt{3}(-4f+3)\sin\alpha + 3\cos\alpha \end{cases} \quad (10)$$

And $$f = \frac{L_a}{(L_{ac}+2L_a)}.$$

From equations (6) and (9), it can be seen that the DC voltage and DC current expressions will contain two unknowns, $\alpha$ and $\beta$. In order to find the expressions for DC current and DC voltage, two additional constraints are needed.

For the DC side, the following constraint always exists:

$$U_{dc} = I_{dc} R_{dc}. \tag{11}$$

However, only one constraint cannot solve the analytical expression of the DC current, so the value of the initial conduction angle $\alpha$ also needs to be predicted.

Derivation step 3: Initial conduction angle prediction

In FIG. 1, when only diodes D4, D5 and D6 are on, ignoring the DC current ripple, the voltage $u_{D1}$ across D1 can be found. when $u_{D1} > 0$, D1 is on, the converter will have four diodes D4, D5, D6 and D1 on at the same time, consider the moment when $u_{D1}$ crosses zero and starts to grow positively as the initial conduction angle $\alpha$ of current $i_1$. Let $u_{D1} = 0$, then the initial conduction phase angle $\alpha$ is obtained to satisfy the following relation.

$$\tan\alpha = \frac{3-k}{\sqrt{3}(k+1)} \tag{12}$$

Derivation Step 4: Analytical expression of steady-state DC fault current

Substituting the two constraints shown in Eqs. (12) and (11) into the DC current and DC voltage expressions, the analytical expression for the mean value of the MMC steady-state DC fault current is obtained as:

$$I_{dc} = \frac{3\sqrt{3}(1-k)\sqrt{3+k^2}\, U_s}{3X_{ac}(3-k) + \pi R_{dc}(1-k^2)} \tag{13}$$

Derivation Step 5: Solving for the conduction overlap angle

Substituting the analytical expression (13) for the mean value of the steady-state DC fault current into (6), the On-state overlap angle $\beta$ is obtained as:

$$\beta = \arcsin\frac{(4\omega/U_s)I_{dc} - C}{\sqrt{A^2 + B^2}} + \arctan\frac{B}{A} \tag{14}$$

Derivation Step 6: Steady-state AC fault current amplitude expression

The expressions for $i_1$ and $\beta$ have been obtained in the above procedure. Substituting $i_1$ and $\beta$ into equation (4), the amplitude of the MMC steady-state AC fault current is found as:

$$I_{sm} = \frac{3\sqrt{3}(1-k)\sqrt{3+k^2}\, U_s}{3X_{ac}(3-k) + \pi R_{dc}(1-k^2)} \tag{15}$$

Derivation Step 7: Phase angle expression for steady-state AC fault current

According to the power conservation on the AC and DC sides of the converter, the phase angle $\varphi$ of the MMC steady-state AC fault current is found as:

$$\varphi = \arccos(R_{dc}I_{dc}^2/(U_s I_{sm})) \tag{16}$$

Expressions For Ac And Dc Side Fault Currents In The Remaining Modes

Similarly, without considering the AC side resistance, the analytical expressions of steady-state AC and DC currents for mode A, mode C and mode D can be derived from the above seven steps, and due to the long derivation process, the expressions of steady-state AC and DC fault currents for mode A, mode C and mode D are given here directly.

Mode A:

The average value of the steady-state DC fault current is $$I_{dc} = \frac{9\sqrt{3}(1-k)U_s}{2\sqrt{(9X_{ac})^2 + (\sqrt{3}(1-k)\pi R_{dc})^2}}. \tag{17}$$

The steady-state AC fault current amplitude is $$I_{sm} = \frac{\pi}{3} \frac{9\sqrt{3}(1-k)U_s}{2\sqrt{(9X_{ac})^2 + (\sqrt{3}(1-k)\pi R_{dc})^2}} \tag{18}$$

Mode C

The average value of the steady-state DC fault current is $$I_{dc} = \frac{3(1-k)k\sqrt{7-4k+k^2}\, U_s}{k(6-5k+k^2)X_{ac} + (1-k^2)\pi R_{dc}}. \tag{19}$$

The steady-state AC fault current amplitude is $$I_{sm} = \frac{U_s}{X_{ac}} \frac{1}{2(k-3)(k-2)\sqrt{7-4k+k^2}} \begin{pmatrix} 6\sqrt{3}(k-1)(k-2)\sin\beta + \\ (24 - 55k + 41k^2 - 11k^3 + k^4)\cos\beta + \\ (7k - 11k^2 + 5k^3 - k^4) \end{pmatrix} \tag{20}$$

where $\beta$ is obtained by equation (14) in mode C.

The steady-state AC fault current phase angle is obtained by equation (16) in mode C.

Mode D:

The average value of the steady-state DC fault current is $$I_{dc} = \frac{3k(1-k)U_s}{k(2-k)X_{ac} + (1-k)\pi R_{dc}} \tag{21}$$

The steady-state AC fault current amplitude is $$I_{sm} = \frac{U_s}{X_{ac}} \frac{k(k-1)}{(k-2)}\left(\frac{\sqrt{3}}{4}\sin\beta + \frac{1}{4}\cos\beta + 2\right) \tag{22}$$

where $\beta$ is obtained by equation (14) in mode D.

The steady-state AC fault current phase angle is obtained by equation (16) in mode D.

Figure 3:
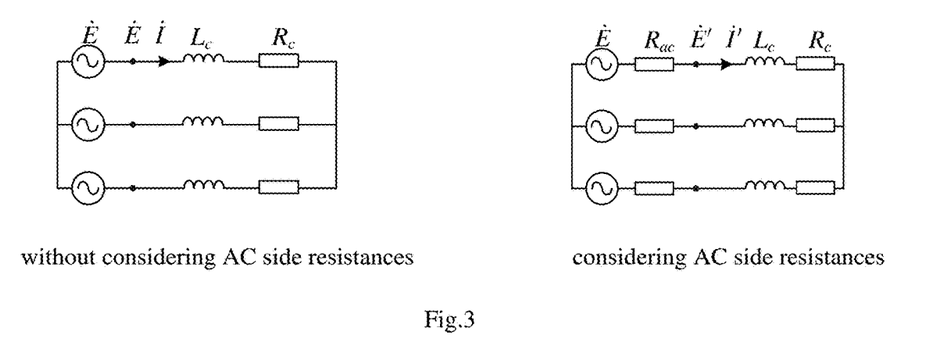
FIG. 3 is a three-phase equivalent circuit diagram of an MMC provided by embodiments of the present invention.

Derivation Step 8: Steady-State Ac And Dc Fault Current Expressions Considering AC Side Resistance The presence of AC-side damping causes a change in the amplitude $U_s$ of the AC-side power supply of the converter. In steady-state operation, the AC side is tri-symmetric, so the converter without AC side damping can be equated to a three phase symmetric load with impedance Zc (Zc=Rc+jXc), and its equivalent circuit is shown in FIG. 3(a). Among them, the AC side of the converter voltage and current phase quantities are Ė, İ, and their amplitudes are $U_s$, $I_{sm}$. Considering the AC side damping of the converter can be equivalent to the form shown in FIG. 3(b), the equivalent voltage and current phase quantities of the AC side of the converter are Ė', Ė', and their amplitudes are $U_s$ $I_{sm}$, respectively.

The updated MMC steady-state AC fault current amplitude and phase angle are obtained from the three-phase equivalent circuit diagram as:

$$I'_{sm} = \frac{U_s}{\sqrt{(R_{ac} + R_c)^2 + X_c^2}} \quad (23)$$

$$\varphi' = \arctan \frac{X_c}{R_{ac} + R_c} \quad (24)$$

Where $$R_c = \frac{U_s \cos\varphi}{I_{sm}}, \quad X_c = \frac{U_s \sin\varphi}{I_{sm}}$$

The updated AC-side power amplitude is:

$$U_s' = \sqrt{(U_s - R_{ac}I_{sm}'\cos(\varphi'))^2 + (R_{ac}I_{sm}'\sin(\varphi'))^2} \quad (25)$$

The MMC steady-state DC fault current considering the AC side resistance is obtained by replacing $U_s$ in the derived expression with the new AC supply amplitude $U_s'$.

The steady-state AC and DC fault current expressions for the MMC considering the AC side resistance are obtained by the above eight steps.

3 MMC Steady-State AC and DC Fault Current Calculation Process

The analytical expressions for the steady-state AC and DC fault currents in each mode were derived in the previous section, but before calculating them, it is necessary to determine the operating mode in which the converter is operated. For this purpose, so that the DC fault currents in each adjacent mode are equal, the dividing resistance of each mode can be found as $$\begin{cases} R_{A/B} = \frac{X_{ac}}{\pi} \frac{9(1+k)}{(3-4k+k^2)} \\ R_{B/C} = \frac{X_{ac}}{\pi} \frac{(k^2-3k)\left((k-2)\sqrt{9+3k^2} + 3\sqrt{7-4k+k^2}\right)}{(k^2-1)\left(\sqrt{9+3k^2} - k\sqrt{7-4k+k^2}\right)} \\ R_{C/D} = \frac{X_{ac}}{\pi} \frac{(2k-k^2)\left(\sqrt{7-4k+k^2} - 3+k\right)}{(k-1)\left(\sqrt{7-4k+k^2} - 1-k\right)} \end{cases} \quad (26)$$

Figure 4:
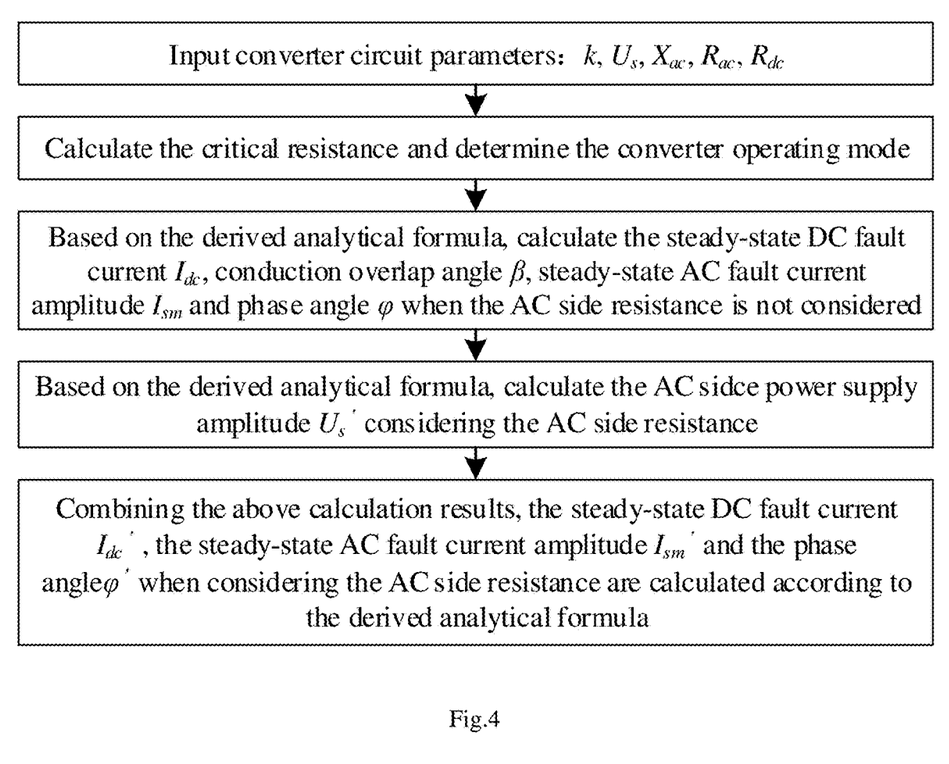
FIG. 4 is a flow chart of the steady-state fault current calculation for the AC and DC sides of an MMC provided by embodiments of the present invention.

The operating mode can be determined according to the size of the DC-side resistance and critical resistance, and the analytical expression for the fault current in each operating mode can be used immediately afterwards for calculation. FIG. 4 shows a flow chart for calculating the steady-state fault current on the AC and DC sides of the MMC provided by embodiments of the present invention, and the overall calculation flow is as follows.

1) Input the MMC parameters k, $U_s$, $X_{ac}$, $R_{ac}$, $R_{dc}$ and calculate the critical resistance according to equation (26).

2) Determine the operating mode of the MMC according to the critical resistance value: when the DC side resistance meets $R_{A/B} \leq R_{dc}$, the MMC is in mode A; when the DC side resistance meets $R_{B/C} \leq R_{dc} \leq R_{A/B}$, the MMC is in mode B; when the DC side resistance meets $R_{C/D} \leq R_{dc} \leq R_{B/C}$, the MMC is in mode C; when the DC side resistance meets $0 \leq R_{dc} \leq R_{C/D}$, the MMC is in mode D.

3) Calculate the steady-state DC fault current $I_{dc}$ when the AC side resistance is not considered: mode A uses equation (17), mode B uses equation (13), mode C uses equation (19), and mode D uses equation (21).

4) Calculate the conduction overlap angle β without considering the AC side resistance according to the DC current: mode A conduction overlap angle is zero, and the phase angles of mode B, C and D are obtained by equation (14) in the corresponding derivation process.

5) Calculation of steady-state AC fault current amplitude $I_{sm}$ and phase angle φ when AC side resistance is not considered based on DC current and On-state overlap angle: Eqs. (18) and (16) are used for mode A, Eqs. (17) and (16) for mode B, Eqs. (20) and (16) for mode C, and Eqs. (22) and (16) for mode D.

6) Calculate the steady-state AC fault current amplitude $I_{sm}'$, phase angle φ' and updated power supply amplitude $U_s'$ when considering the AC side resistance based on the results of the previous steps: equations (23), (24) and (25).

7) The steady-state DC fault currents of modes A, B, C, and D are calculated by replacing $U_s$ in equations (17), (13), (19), and (21) with the new AC power supply magnitudes $U_s'$, respectively, considering the AC side resistance.

In working mode A:

The average value of the steady-state DC fault current when considering the AC side resistance is $$I_{dc} = \frac{9\sqrt{3}(1-k)U_s'}{2\sqrt{(9X_{ac})^2 + (\sqrt{3}(1-k)\pi R_{dc})^2}}.$$

In working mode B:

The average value of the steady-state DC fault current when considering the AC side resistance is $$I_{dc} = \frac{3\sqrt{3}(1-k)\sqrt{3+k^2}\,U_s'}{3X_{ac}(3-k) + \pi R_{dc}(1-k^2)}$$

In working mode C:

The average value of the steady-state DC fault current when considering the AC side resistance is $$I_{dc} = \frac{3(1-k)k\sqrt{7-4k+k^2}\,U_s'}{k(6-5k+k^2)X_{ac} + (1-k^2)\pi R_{dc}}$$

In working mode D:

The average value of the steady-state DC fault current when considering the AC side resistance is $$I_{dc} = \frac{3k(1-k)U'_s}{k(2-k)X_{ac} + (1-k)\pi R_{dc}}$$

4 Validation

Figure 5:
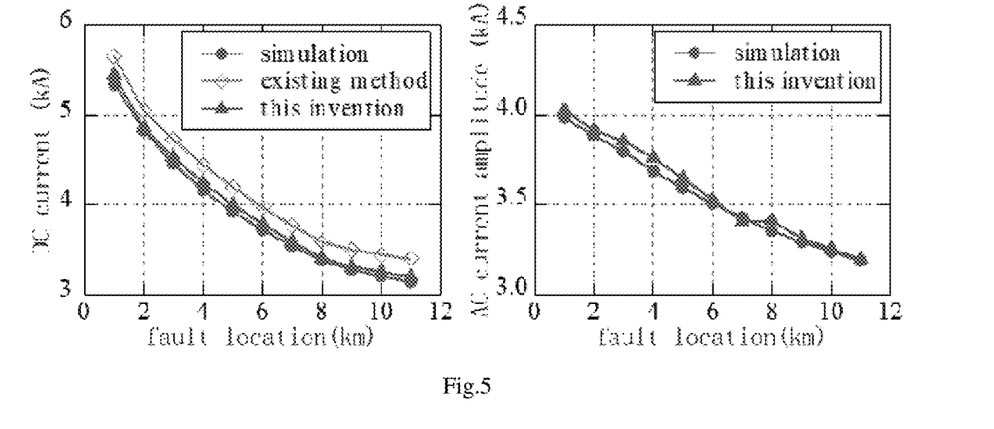
FIG. 5 is a schematic diagram of a steady-state fault current calculation result at different fault distances provided by embodiments of the present invention.
Figure 6:
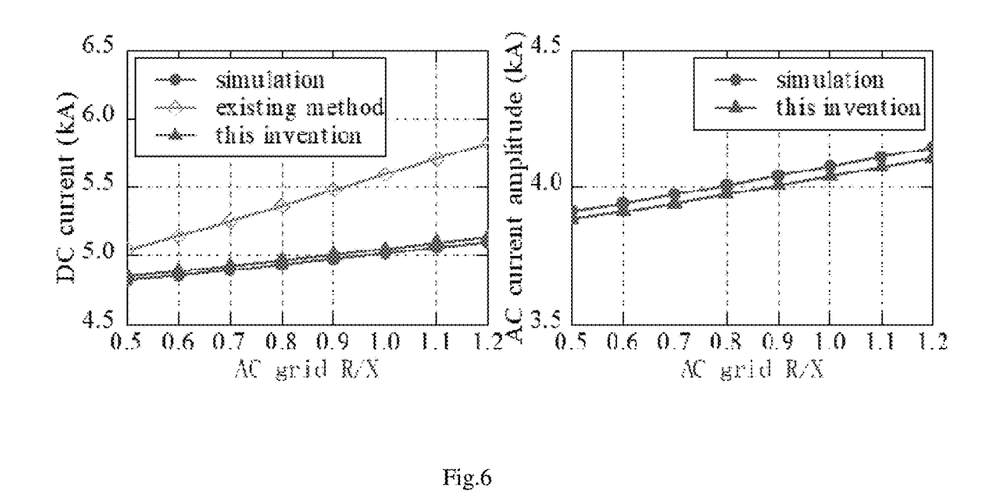
FIG. 6 is a schematic diagram of the steady-state fault current calculation results at different AC side R/X provided by embodiments of the present invention.

The parameters of the converter used for the verification are shown in Tab. 1. FIG. 5 compares the results of the steady-state fault current calculation obtained by applying the present invention, the results obtained by simulation and the results obtained by using the external characteristics method of the converter for different fault distances. FIG. 6 compares the results of the steady-state fault current calculation, the results obtained by simulation and the results obtained by the external characteristics of the converter with different AC side R/X.

TABLE 1 default values of converter parameters used for validation

| Items | Parameters | Values | Items | Parameters | Values |
|---|---|---|---|---|---|
| AC grid | Rated voltage | 10.5 kV | MMC | Rated active power | 20 MW |
| | SCR | 5 | | Arm inductance | 3.5 mH |
| | X/R | 0.5 | DC | DC voltage | ±10 kV |
| transformer | Connection type | Dyn11 | side | Length of DC line | 11 km |
| | ratings | 24 MVA | | Per unit resistance of the DC line | 0.0773 ohm/km |
| | Voltage ratio | 10.5/10.5 kV | | Per unit inductance of the DC line | 0.03578 mH/km |
| | Leakage reactance | 0.1 p.u. | | | |

In summary, the application of the method of the embodiment of the present invention is able to simultaneously obtain the fault currents on the AC side and the value side of the modular MMC during the steady-state phase; the calculation accuracy is high, the calculation process is simple, and no additional iterative algorithms are required; it is able to adapt to scenarios where the AC side of the grid is damped; and the analytical expressions provided reflect the intrinsic relationship between the system parameters and the steady-state fault currents.

The embodiment of the present invention proposes a practical analytical calculation method of MMC steady-state fault current with higher accuracy and applicability, which can simultaneously solve the AC fault current and DC fault current amplitude in the fault steady-state phase, improve the accuracy and applicability of existing MMC steady-state fault current calculation, simplify the calculation process by providing the analytical expression of fault current, and reflect the intrinsic relationship between system parameters and fault current level, which can provide reference for the development of MMC-based fault current calculation standards for flexible DC power networks.

It will be understood by those of ordinary skill in the art that the accompanying drawings are only a schematic representation of an embodiment and that the modules or processes in the accompanying drawings are not necessarily necessary to implement the present invention.

As can be seen from the above description of the embodiment, it is clear to those skilled in the art that the present invention can be implemented with the aid of software plus the necessary common hardware platform. Based on this understanding, the technical solution of the present invention, which essentially or rather contributes to the prior art, may be embodied in the form of a software product, which may be stored in a storage medium, such as ROM/RAM, disk, CD-ROM, etc., comprising a number of instructions to enable a computer device (which may be a personal computer, a server, or a network device, etc.) to perform the method described in various embodiments or parts of embodiments of the present invention. embodiment or some part of an embodiment of the invention.

Each embodiment in this specification is described in a progressive manner, and the same and similar parts of each embodiment can be referred to each other, and each embodiment focuses on the differences from other embodiments. In particular, for the device or system embodiment, because it is basically similar to the method embodiment, so the description is relatively simple, the relevant part of the method embodiment can be seen in the description. The device and system embodiments described above are merely schematic, wherein the units described as separate components illustrated may or may not be physically separated, and the components shown as units may or may not be physical units, i.e., they may be located in one place or may be distributed to multiple network units. Some or all of these modules can be selected according to practical needs to achieve the purpose of this embodiment solution. It can be understood and implemented by a person of ordinary skill in the art without creative work.

The above mentioned is only a better specific implementation of the present invention, but the scope of protection of the present invention is not limited to it, and any changes or substitutions that can be readily thought of by any person skilled in the art within the technical scope disclosed by the present invention should be covered by the scope of protection of the present invention. Therefore, the scope of protection of the present invention should be subject to the scope of protection of the claims.

What is claimed is:

1. A method for determining a steady-state fault current of modular multilevel converter MMC comprising the following steps:

step 1: obtaining the parameters of the modular multilevel converter MMC:

k, $U_s$, $X_{ac}$, $R_{dc}$; wherein, k is the bridge arm inductance coefficient, $U_s$ is the phase voltage amplitude of the equivalent power supply at the AC side of the MMC, $X_{ac}$ is the equivalent reactance at the AC side of the MMC, $R_{dc}$ and is the resistance at the DC side of the MMC; creating the DC side critical resistance value $R_{A/B}$, $R_{B/C}$ and $R_{C/D}$ of the MMC according to the parameters;

step 2: when criterion $R_{A/B} \leq R_{dc}$ is satisfied, the MMC is considered to operate in mode A; When criterion $R_{B/C} \leq R_{dc} \leq R_{A/B}$ is satisfied, the MMC is considered to operate in mode B; When criterion $R_{C/D} \leq R_{dc} \leq R_{B/C}$ is satisfied, the MMC is considered to operate in mode C; When criterion $0 \leq R_{dc} \leq R_{C/D}$ is satisfied, the MMC is considered to operate in mode D; In operating mode A, $\gamma=0°$, in operating mode B, $0°<\gamma<60°$, in operating mode C, $60°<\gamma<120°$, in operating mode D, $120°<\gamma<180°$, wherein $\gamma$ is the conduction overlap angle of the upper and lower bridge arms of each phase of MMC in half an AC cycle;

Step 3: calculate the average value of steady-state DC fault current $I_{dc}$ and conduction overlap angle $\beta$ under operating modes A, B, C and D without considering the AC side resistance according to the parameters k, $U_s$, $R_{dc}$ and the DC side critical resistance value $R_{A/B}$, $R_{B/C}$ and $R_{C/D}$, respectively; in operating mode A, $\beta=\gamma=0°$, in operating mode B, $0°<\beta=\gamma<60°$, in operating mode C, $0°<\beta=\gamma-60°<60°$, in operating mode D, $0°<\beta=\gamma-120°<60°$; and Step 4: calculate the steady-state AC fault current amplitude $I_{sm}$ and phase angle $\varphi$ of the operating modes A, B, C and D without considering the AC side resistance according to the DC current and conduction overlap angle of the operating modes A, B, C and D.

2. The method according to claim 1, wherein the equivalent circuit structure of MMC fault steady-state stage includes four parts: AC power grid unit, converter transformer, converter and DC side unit connected in series; AC power grid unit includes three-phase equivalent power supply $e_j$ j=a,b,c in parallel, and its amplitude is $U_s$; the three-phase equivalent power supplies $e_a$, $e_b$, and $e_c$ are respectively connected in series with $L_g$ and $R_g$ in the AC power grid unit, $L_t$ and $R_t$ in the converter transformer; $L_g$ and $R_g$ are the equivalent inductance and equivalent resistance of AC power grid, $L_t$ and $R_t$ are the equivalent inductance and equivalent resistance of converter transformer; the three-phase equivalent power supplies $e_a$, $e_b$, and $e_c$ are also connected in series with the A, B and C three-phase diode circuits in the converter; the A-phase diode circuit includes an upper diode D1 and a lower diode D4 connected in series, the B-phase diode circuit includes an upper diode D3 and a lower diode D6 connected in series, and the c-phase diode circuit includes an upper diode d5 and a lower diode D2 connected in series; the DC side unit comprises a DC side inductance $L_{dc}$ and a resistance $R_{dc}$ connected in series; $L_a$ is the MMC bridge arm inductance; in said operating mode A, the upper and lower diodes of each phase of MMC will be turned on 180° alternately, and there are only three diodes in the converter at any time;

in said operating mode C, there is both a simultaneous conduction of 3 diodes and a simultaneous conduction of 4 diodes in the converter in ⅙ of the working frequency cycle, with the converter alternating continuously in 3-4 mode; in said operating mode C, there is both simultaneous conduction of 4 diodes and simultaneous conduction of 5 diodes in the converter during ⅙ of the working frequency cycle, with the converter alternating continuously in 4-5 mode; in said operating mode D, there is both a simultaneous conduction of 5 diodes and a simultaneous conduction of 6 diodes in the ⅙ industrial frequency cycle, with the converter alternating continuously in the 5-6 mode.

3. The method according to claim 1, wherein said creating the critical resistance value $R_{A/B}$, $R_{B/C}$ and $R_{C/D}$ of the MMC based on said parameters k and $X_{ac}$, comprising:

$$\begin{cases} R_{A/B} = \dfrac{X_{ac}}{\pi} \dfrac{9(1+k)}{(3-4k+k^2)} \\ R_{B/C} = \dfrac{X_{ac}}{\pi} \dfrac{(k^2-3k)\left((k-2)\sqrt{9+3k^2}+3\sqrt{7-4k+k^2}\right)}{(k^2-1)\left(\sqrt{9+3k^2}-k\sqrt{7-4k+k^2}\right)} \\ R_{C/D} = \dfrac{X_{ac}}{\pi} \dfrac{(2k-k^2)\left(\sqrt{7-4k+k^2}-3+k\right)}{(k-1)\left(\sqrt{7-4k+k^2}-1-k\right)} \end{cases} \quad (1)$$

wherein $X_{ac}=\omega L_g+\omega L_t$, $X_a=\omega L_a$, $\omega$ is the angular frequency of the AC side.

4. The method according to claim 1, wherein said creating the average values of steady-state DC fault currents $I_{dc}$ and conduction overlap angles $\beta$ for the operating modes A, B, C and D, respectively, when AC side resistance is not considered, based on said parameters k, $U_s$, $R_{dc}$ and critical resistance values $R_{A/B}$, $R_{B/C}$ and $R_{C/D}$, comprising:

the steady-state DC-side fault current of the MMC is the sum of the fault currents of the a,b,c three-phase diode circuit on the upper bridge arm of the MMC, and, that is $i_{dc}=i_1+i_3+i_5$; the a,b,c three-phase diode circuit is symmetrical to each other, the waveforms of $i_1$, $i_3$ and $i_5$ are the same, the initial phase angles differ from each other by 120°, and the peak value of the fault current on the steady-state AC side of the MMC is the same as the peak value of the fault current in each phase of the diode circuit;

the current $i_1$ is divided into multiple intervals and solved one by one according to the states of conduction of the diode circuits of phases a, b and c in the described operating modes A, B, C and D; according to the phase angle relationship between $i_1$, $i_3$ and $i_5$, the value of current $i_3$ and $i_5$ are obtained; according to the value of $i_1$, $i_3$ and $i_5$, and the relationship between DC side voltage and current, the steady-state DC fault current average value $I_{dc}$ and conduction overlap angle $\beta$ of working modes a, B, C and d without considering AC side resistance are deduced.

5. The method according to claim 4, wherein said average values of steady-state DC fault currents $I_{dc}$ and conduction overlap angles $\beta$ for the operating modes A, B, C and D, respectively, without considering the AC side resistance, are calculated based on said parameters k, $U_s$, $R_{dc}$ and critical resistance values $R_{A/B}$, $R_{B/C}$ and $R_{C/D}$, comprising:

the relationship between the average value of DC current $I_{dc}$, AC current amplitude $I_{sm}$ and the current of the a-phase diode circuit on the bridge arm $i_1$ in operating mode B is:

$$I_{dc}=i_1(\omega t=\alpha+\beta+\pi/3) \quad (3)$$

$$I_{sm}=i_1(\omega t=\alpha+\beta+\pi/3) \quad (4)$$

where $\alpha$ is the electrical angle corresponding to the moment when the current $i_1$ crosses zero and starts to rise, and $\beta$ is the onset overlap angle in mode B;

converting the expressions for taking $I_{dc}$ and $I_{sm}$ into expressions for taking $i_1$ in the interval $[\alpha,\alpha+\beta+\pi/3]$; splitting the interval $[\alpha,\alpha+\beta+\pi/3]$ into three subintervals $[\alpha,\alpha+\beta+\pi/3]$ and $[\alpha+\pi/3,\alpha+\beta+\pi/3]$ for segmental solutions:

derivation step 1: Solving for DC current in subinterval 1 ($\omega t \in [\alpha, \alpha+\beta]$), diodes D4, D5, D6, D1 conduct, using the circuit principle to solve the equivalent circuit of the converter at this time to obtain the expressions for the DC voltage $u_{dc}^1$ and bridge arm current $i_1^1$ in subinterval 1;

similarly, in subinterval 2($\omega t \in [\alpha+\beta, \alpha+\pi/3]$) and subinterval 3$[\alpha+\pi/3, \alpha+\beta+\pi/3]$, find the DC-side voltage and the current of diode D1, respectively, denoted as $u_{dc}^2$, $i_1^2$ and $u_{dc}^3$, $i_1^3$;

then $i_1$ is expressed as a segmented function, as shown in the following equation, $$i_1 = \begin{cases} i_1^1, \omega t \in [\alpha, \alpha+\beta] \\ i_1^2, \omega t \in [\alpha+\beta, \alpha+\pi/3] \\ i_1^3, \omega t \in [\alpha+\pi/3, \alpha+\beta+\pi/3] \end{cases} \quad (4)$$

the boundary conditions are shown in the following equation, $$\begin{cases} i_1^1(\omega t = \alpha) = 0 \\ i_1^1(\omega t = \alpha+\beta) = i_2^1(\omega t = \alpha+\beta) \\ i_1^3(\omega t = \alpha+\pi/3) = i_1^2(\omega t = \alpha+\pi/3) \end{cases} \quad (5)$$

combining (4) and (5) and substituting $I_{dc}=i_1(\omega t=\alpha+\gamma+\pi/3)$ into the expression for $i_1$, the DC current expression is found as:

$$I_{dc}=(U_s/4\omega)(A \sin \beta + B \cos \beta + C) \quad (6)$$

wherein, $$\begin{cases} A = (12m - 3p)\sin\alpha + \sqrt{3} p\cos\alpha \\ B = (-12m + 3p)\cos\alpha + \sqrt{3} p\sin\alpha \\ C = (12m - 3p)\cos\alpha + \sqrt{3} p\sin\alpha \end{cases} \quad (7)$$

and $m = \dfrac{1}{3L_{ac}+2L_a}$, $n = \dfrac{2(L_{ac}+L_a)}{(L_{ac}+2L_a)}m$, $p = \dfrac{1}{(L_t+L_a)}$, derivation step 2: solving for DC voltage the DC voltage is obtained by averaging the DC voltage integration over 1/6 of the working frequency period, and the average DC voltage is obtained from the DC voltage of subinterval 1 and subinterval 2 $u_{dc}^1$, $u_{dc}^2$, as follows:

$$U_{dc} = \dfrac{3}{\pi}\left[\int_{(\alpha)/\omega}^{(\alpha+\gamma)/\omega} u_{dc}^1 d(\omega t) + \int_{(\alpha+\gamma)/\omega}^{(\alpha+\pi/3)/\omega} u_{dc}^2 d(\omega t)\right] \quad (8)$$

simplification gives:

$$U_{dc} = (3U_s/4\pi)(D\sin\beta + E\cos\beta + F) \quad (9)$$

$$\begin{cases} D = \sqrt{3}(4f-3)\cos\alpha - 3\sin\alpha \\ E = \sqrt{3}(4f-3)\sin\alpha + 3\cos\alpha \\ F = \sqrt{3}(-4f+3)\sin\alpha + 3\cos\alpha \end{cases} \quad (10)$$

and $f = \dfrac{L_a}{(L_{ac}+2L_a)}$;

from equations (6) and (9), it can be seen that the DC voltage and DC current expressions will contain two unknowns, $\alpha$ and $\beta$; in order to find the expressions for DC current and DC voltage, two additional constraints are needed;

for the DC side, the following constraint always exists:

$$U_{dc}=I_{dc}R_{dc}$$

the value of the initial conduction angle $\alpha$ is predicted;

derivation step 3: initial conduction angle prediction when only diodes D4, D5 and D6 are conducted, the voltage $u_{D1}$, across D1 is obtained, and when $u_{D1}>0$, D1 is on, the converter will have four diodes D4, D5, D6 and D1 on at the same time, consider the moment when $u_{D1}$ crosses zero and starts to grow positively as the initial conduction angle $\alpha$ of current $i_1$; let $u_{D1}=0$, then the initial conduction phase angle $\alpha$ is obtained to satisfy the following relation:

$$\tan\alpha = \dfrac{3-k}{\sqrt{3}(k+1)} \quad (12)$$

derivation step 4: analytical expression of steady-state DC fault current substituting the two constraints shown in Eqs. (11) and (12) into the DC current and DC voltage expressions, the analytical expression for the mean value of the MMC steady-state DC fault current is obtained as:

$$I_{dc} = \dfrac{3\sqrt{3}(1-k)\sqrt{3+k^2}\, U_s}{3X_{ac}(3-k)+\pi R_{dc}(1-k^2)} \quad (13)$$

derivation step 5: solving for the conduction overlap angle
substituting the analytical expression (13) for the mean value of the steady-state DC fault current into (6), the on-state overlap angle $\beta$ is obtained as:

$$\beta = \arcsin\dfrac{(4\omega/U_s)I_{dc}-C}{\sqrt{A^2+B^2}} + \arctan\dfrac{B}{A} \quad (14)$$

derivation step 6: steady-state AC fault current amplitude expression substituting $i_1$ and $\beta$ into equation (3), the amplitude of the MMC steady-state AC fault current is found as:

$$I_{sm} = \dfrac{3\sqrt{3}(1-k)\sqrt{3+k^2}\, U_s}{3X_{ac}(3-k)+\pi R_{dc}(1-k^2)} \quad (15)$$

and derivation step 7: phase angle expression for steady-state AC fault current according to the power conservation on the AC and DC sides of the converter, the phase angle $\varphi$ of the MMC steady-state AC fault current is found as:

$$\varphi = \arccos(R_{dc}I_{dc}^2/(U_s I_{sm})) \quad (16).$$

6. The method according to claim 5, wherein said on-state DC fault current average value $I_{dc}$ and on-state overlap angle $\beta$ for the operating modes A, B, C and D, respectively, without considering the AC side resistance, calculated from said parameters k, $U_s$, $R_{dc}$ and critical resistance values $R_{A/B}$, $R_{B/C}$ and $R_{C/D}$, comprising:

in the operating mode A:
the average value of the steady-state DC fault current is $$I_{dc} = \frac{9\sqrt{3}(1-k)U_s}{2\sqrt{(9X_{ac})^2 + (\sqrt{3}(1-k)\pi R_{dc})^2}} \quad (17)$$

the steady-state AC fault current amplitude is:

$$I_{sm} = \frac{\pi}{3}\frac{9\sqrt{3}(1-k)U_s}{2\sqrt{(9X_{ac})^2 + (\sqrt{3}(1-k)\pi R_{dc})^2}} \quad (18)$$

in the operating mode C:
the average value of the steady-state DC fault current is $$I_{dc} = \frac{3(1-k)k\sqrt{7-4k+k^2}\, U_s}{k(6-5k+k^2)X_{ac} + (1-k^2)\pi R_{dc}} \quad (19)$$

the steady-state AC fault current amplitude is:

$$I_{sm} = \frac{U_s}{X_{ac}}\frac{1}{2(k-3)(k-2)\sqrt{7-4k+k^2}}\begin{pmatrix}6\sqrt{3}(k-1)(k-2)\sin\beta + \\ (24-55k+41k^2-11k^3+k^4)\cos\beta + \\ (7k-11k^2+5k^3-k^4)\end{pmatrix} \quad (20)$$

wherein $\beta$ is obtained by equation (14) in mode C;
the steady-state AC fault current phase angle is obtained by equation (16) in mode C;
in the operating mode D:
the average value of the steady-state DC fault current is $$I_{dc} = \frac{3k(1-k)U_s}{k(2-k)X_{ac} + (1-k)\pi R_{dc}} \quad (21)$$

the steady-state AC fault current amplitude is:

$$I_{sm} = \frac{U_s}{X_{ac}}\frac{k(k-1)}{(k-2)}\left(\frac{\sqrt{3}}{4}\sin\beta + \frac{1}{4}\cos\beta + 2\right) \quad (22)$$

wherein $\beta$ is obtained by equation (14) in mode D.

7. The method according to claim 5, wherein said method further comprising:
the calculation process of the MMC steady-state AC and DC fault currents considering the AC side resistance includes: the converter without considering the AC side damping is equivalent to a three-phase symmetrical load with impedance $Z_c$ ($Z_c = R_c + jX_c$), the AC side voltage and current phase quantities of the converter are $\dot{E}$, $\dot{I}$, and their amplitudes are $U_s$, $I_{sm}$; when the AC side resistance is considered, the equivalent AC side voltage and current phase quantities of the converter are $\dot{E}'$, $\dot{I}'$, and their amplitudes are $U_s'$, $I_{sm}'$; the updated MMC steady-state AC fault current amplitude and phase angle are obtained from the three-phase equivalent circuit diagram as:

$$I_{sm}' = \frac{U_s}{\sqrt{(R_{ac}+R_c)^2 + X_c^2}} \quad (24)$$

$$\varphi' = \arctan\frac{X_c}{R_{ac}+R_c} \text{ wherein, } R_c = \frac{U_s\cos\varphi}{I_{sm}}, X_c = \frac{U_s\sin\varphi}{I_{sm}}; \quad (25)$$

the updated AC-side power amplitude is:

$$U_s' = \sqrt{(U_s - R_{ac}I_{sm}'\cos(\varphi'))^2 + (R_{ax}I_{sm}'\sin(\varphi'))^2} \quad (26)$$

the MMC steady-state DC fault current considering the AC side resistance is obtained by replacing $U_s$ in the derived expression with the new AC supply amplitude $U_s'$;

in the operating mode A:
the average value of the steady-state DC fault current when considering the AC side resistance is $$I_{dc} = \frac{9\sqrt{3}(1-k)U_s'}{2\sqrt{(9X_{ac})^2 + (\sqrt{3}(1-k)\pi R_{dc})^2}};$$

in the operating mode B:
the average value of the steady-state DC fault current when considering the AC side resistance is $$I_{dc} = \frac{3\sqrt{3}(1-k)\sqrt{3+k^2}\, U_s'}{3X_{ac}(3-k) + \pi R_{dc}(1-k^2)};$$

in the operating mode C:
the average value of the steady-state DC fault current when considering the AC side resistance is $$I_{dc} = \frac{3(1-k)k\sqrt{7-4k+k^2}\, U_s'}{k(6-5k+k^2)X_{ac} + (1-k^2)\pi R_{dc}};$$

in the operating mode D:
the average value of the steady-state DC fault current when considering the AC side resistance is $$I_{dc} = \frac{3k(1-k)U_s'}{k(2-k)X_{ac} + (1-k)\pi R_{dc}}.$$

* * * * *